US009397607B2

United States Patent
Atchley et al.

(10) Patent No.: US 9,397,607 B2
(45) Date of Patent: Jul. 19, 2016

(54) SELF-LOCKING PHOTOVOLTAIC MODULE MOUNTING SYSTEM

(71) Applicant: SolarCity Corporation, San Mateo, CA (US)

(72) Inventors: Brian Atchley, San Rafael, CA (US); Tyrus Hudson, San Rafael, CA (US); David Molina, San Rafael, CA (US); Jack Raymond West, San Rafael, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days.

(21) Appl. No.: 14/739,942

(22) Filed: Jun. 15, 2015

(65) Prior Publication Data
US 2015/0280639 A1      Oct. 1, 2015

Related U.S. Application Data

(63) Continuation-in-part of application No. 14/548,572, filed on Nov. 20, 2014, now Pat. No. 9,062,897, which is a continuation of application No. 14/252,985, filed on Apr. 15, 2014, now Pat. No. 9,097,441, which is a continuation of application No. 13/673,985, filed on Nov. 9, 2012, now Pat. No. 8,756,881.

(60) Provisional application No. 61/557,821, filed on Nov. 9, 2011, provisional application No. 61/656,230, filed on Jun. 6, 2012.

(51) Int. Cl.
| | |
|---|---|
| *E04D 13/18* | (2014.01) |
| *H02S 20/23* | (2014.01) |
| *F16B 5/02* | (2006.01) |

(Continued)

(52) U.S. Cl.
CPC . *H02S 20/23* (2014.12); *F16B 5/02* (2013.01); *F24J 2/5205* (2013.01); *F24J 2/5245* (2013.01); *F24J 2/5258* (2013.01); *H01L 31/042* (2013.01); *H01L 31/0481* (2013.01); *F24J 2/5252* (2013.01); *F24J 2/5254* (2013.01); *F24J 2002/5226* (2013.01); *F24J 2002/5294* (2013.01); *F24J 2002/5296* (2013.01); *Y02B 10/12* (2013.01); *Y02B 10/20* (2013.01); *Y02E 10/47* (2013.01)

(58) Field of Classification Search
CPC ....... Y02B 10/12; F24J 2/5245; F24J 2/5252; F24J 2002/5294; F24J 2/5258; F24J 2/5254
USPC .......... 52/24, 27, 58, 60, 62, 219, 173.3, 698; 248/148, 237, 48.1, 200, 205.1; 136/244; 126/623
See application file for complete search history.

(56) References Cited

U.S. PATENT DOCUMENTS

| | | | | |
|---|---|---|---|---|
| 8,585,000 | B2 * | 11/2013 | McPheeters | ........ E04D 13/1476 248/228.2 |
| 8,752,338 | B2 * | 6/2014 | Schaefer | ................ F24J 2/5245 52/173.3 |

(Continued)

*Primary Examiner* — Chi Q Nguyen
(74) *Attorney, Agent, or Firm* — Kilpatrick Townsend & Stockton LLP

(57) ABSTRACT

A photovoltaic module mounting assembly including a photovoltaic module lever lock and base portion for attaching photovoltaic modules to a roof surface. The base portion includes one or more parallel channels that provide access to one or more corresponding recesses formed in a top surface of the base portion. The lever lock includes a lobe at one end, a torque lever at the other and supports a photovoltaic module connector. The lobe is dimensioned to fit into the channel at a first orientation, and upon rotation of approximately 90 degrees, to fit into the recess at a second orientation. The module connector may support two or more photovoltaic modules.

20 Claims, 9 Drawing Sheets

(51) Int. Cl.
*H01L 31/042* (2014.01)
*H01L 31/048* (2014.01)
*F24J 2/52* (2006.01)

(56) References Cited

U.S. PATENT DOCUMENTS

| | | | | |
|---|---|---|---|---|
| 8,756,881 B2 * | 6/2014 | West | ......................... | E04B 1/38 248/148 |
| 8,839,575 B1 * | 9/2014 | Liu | ............................ | F24J 2/52 248/295.11 |
| 8,898,971 B2 * | 12/2014 | West | ....................... | H01L 31/18 52/173.3 |
| 9,003,729 B2 * | 4/2015 | West | .................... | H01L 31/0422 52/173.3 |
| 9,062,897 B2 * | 6/2015 | West | ......................... | E04B 1/38 |
| 9,097,441 B2 * | 8/2015 | West | ......................... | E04B 1/38 |
| 2012/0167364 A1 * | 7/2012 | Koch | ......................... | F16B 2/12 29/281.1 |
| 2012/0193310 A1 * | 8/2012 | Fluhrer | ................... | F24J 2/5203 211/41.1 |
| 2012/0199181 A1 * | 8/2012 | Newman | ................. | F24J 2/5205 136/251 |
| 2014/0175244 A1 * | 6/2014 | West | ...................... | F24J 2/5205 248/316.7 |
| 2015/0107168 A1 * | 4/2015 | Kobayashi | ............ | F24J 2/5245 52/173.3 |

* cited by examiner

SELF-LOCKING PHOTOVOLTAIC MODULE MOUNTING SYSTEM

CROSS REFERENCE TO RELATED APPLICATIONS

This application is a continuation-in-part of U.S. application Ser. No. 14/548,572, now U.S. Pat. No. 9,062,897, filed Nov. 20, 2014, which is a continuation of U.S. application Ser. No. 14/252,985, now U.S. Pat. No. 9,097,441, filed Apr. 15, 2014, which is a continuation of U.S. application Ser. No. 13/673,985, filed Nov. 9, 2012, now U.S. Pat. No. 8,756,881, issued Jun. 24, 2014, which claims priority to U.S. Provisional Ser. No. 61/557,821, filed Nov. 9, 2011, and U.S. Provisional Ser. No. 61/656,230, filed Jun. 6, 2012. The foregoing applications are incorporated by reference in their entirety as if fully set forth herein.

FIELD OF THE INVENTION

The invention relates generally to mounting systems for photovoltaic modules, and more specifically to roof-top mounting systems for use in residential and commercial applications.

BACKGROUND OF THE INVENTION

The popularity of photovoltaic or "solar" power is soaring. Solar costs have now reached near parity with fossil fuel-based energy and as a result, it is being rapidly deployed around the world. Reductions in global $CO_2$ emissions will only be possible by migrating the world off of fossil fuels and into solar and other alternative and renewable energy sources. However, because the true cost of fossil fuel-based energy is not currently reflected in its retail sales price, further cost reductions, both in labor and materials, are necessary to insure that solar deployments continue to grow and ultimate displace more pollutive energy sources.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF THE DISCLOSURE

Figure 1:
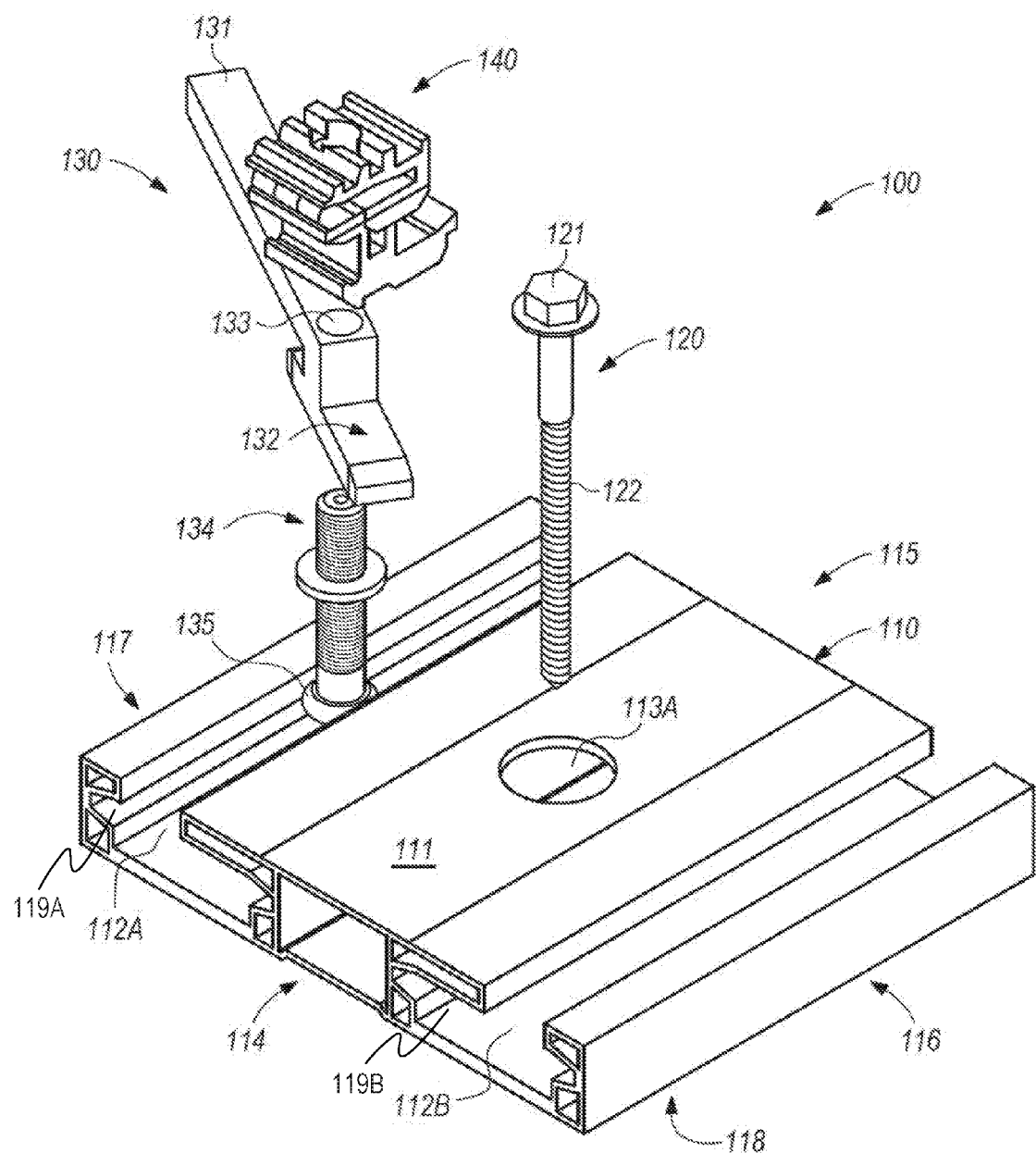
FIG. 1 is a plan view of a photovoltaic mounting system according to various embodiments of the invention.
Figure 2:
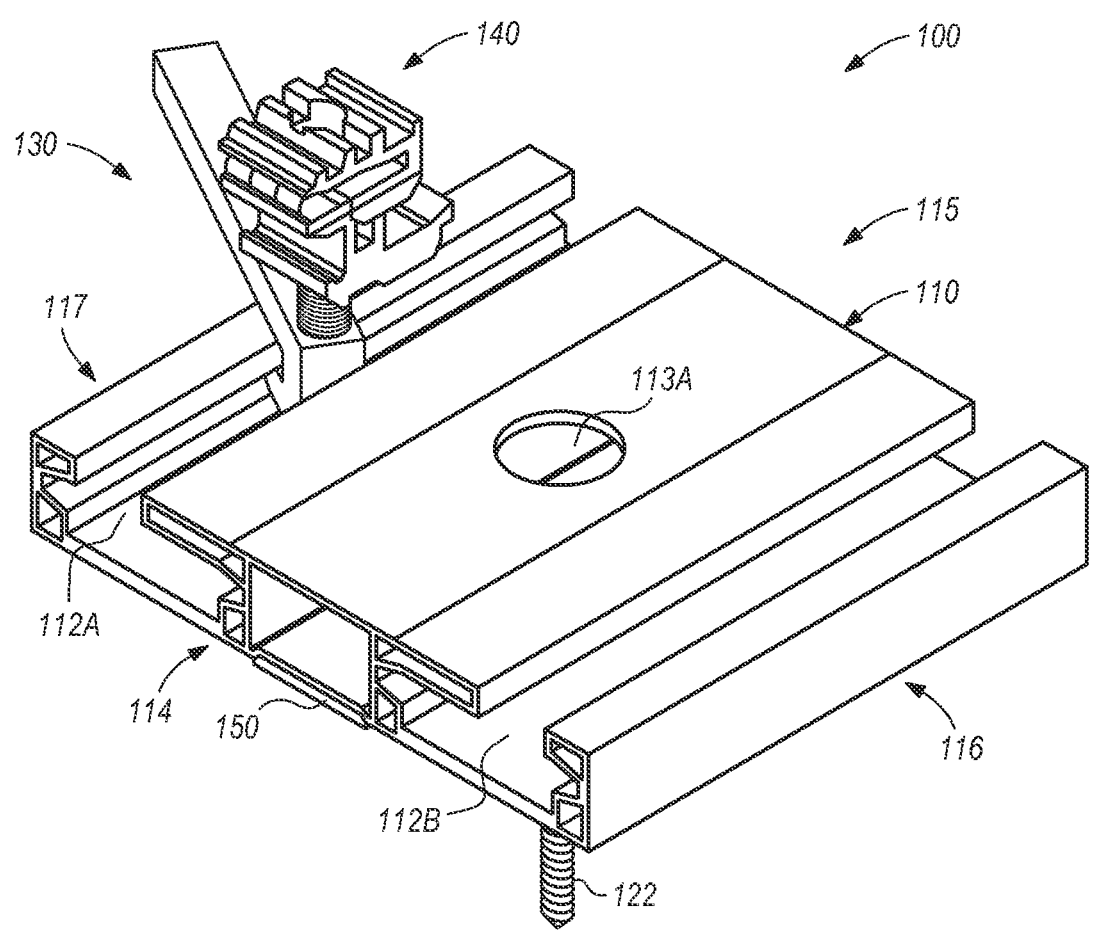
FIG. 2 is another plan view of a photovoltaic mounting system according to various embodiments of the invention.

The following description is intended to convey a thorough understanding of the embodiments described by providing a number of specific embodiments and details involving a roof-top photovoltaic mounting system. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

As noted above, there is an ongoing need to reduce the labor and materials costs associated with photovoltaics. Various embodiments of the invention accomplish this with a self-locking mounting system for photovoltaic panels that reduces and ideally minimizes tool usage when installing PV. Various embodiments may utilize a photovoltaic module lever-lock that couples together two photovoltaic modules with manually applied torque. In various embodiments the lever-lock may be joined to a planar base portion having a pair of parallel channels that enable the lever-lock to be installed with adjustability in the east-west (left side to right side) and north-south (roof eave to roof ridge) directions. In various embodiments, the lever-lock may incorporate a torque lever for torqueing the coupling device into one of the channels formed in the base portion. In various embodiments the, lever-lock may incorporate a photovoltaic module coupling that couples together two or more photovoltaic modules. Various embodiments may also include a partial flashing portion that covers the up-roof end of the base portion as well as a lag-bolt screw opening formed therein. Other embodiments may include a bottom flashing. These and other embodiments are discussed in greater detail in the paragraphs that follows.

FIGS. 1-9 illustrate various views of a first exemplary embodiment of a photovoltaic mounting system according to this invention. The system 100 according to the exemplary embodiment illustrated in these figures comprises base portion 110, which in this example is an substantially planar extrusion having top sky-facing surface 111, bottom roof-facing surface 118, and channels 112A, 112B that run between down-roof end 114 and up-roof end 115. Each channel 112A, 112B has an opening that leads to a corresponding larger diameter, asymmetrical recess running the length of extrusion (e.g., see recesses 119A and 119B depicted in FIG. 1). The outside of each such recess is framed by respective sides 117 and 116 of base portion 110 and by the middle of base portion 110.

System 100 also comprises manually actuated lever lock 130. In various embodiments, lever lock 130 comprises torque lever 131, lobe 132, threaded opening 133 and threaded stud 134, which terminates at pedestal 135. In various embodiments, lobe 132 may be dimensioned so that when it is aligned lengthwise with (i.e., parallel with) either channel 112A or 122B, it will fit within the channel opening. By manually applying approximately 90 degrees of rotational torque to lever 131, lobe 132 fits within the asymmetric recess in each channel, thereby locking it into place so that the main axis of lobe 132 is approximately oriented perpendicular to channel 112A. In various embodiments, torque may be applied either clockwise or counterclockwise, however, as shown, the recesses in channels 112A and 112B, as well as lobe 132 all have an orientation that results in torque lever 131 pointing outward, perpendicular to the outer surface of either side 117 or 116. It should be appreciated that in various embodiments, the orientation of either recess, lobe 132, or both, may be oriented differently so that when locked into place, torque lever 131 points in towards the center of base portion 110. Such modifications are within the scope of the invention.

Figure 3:
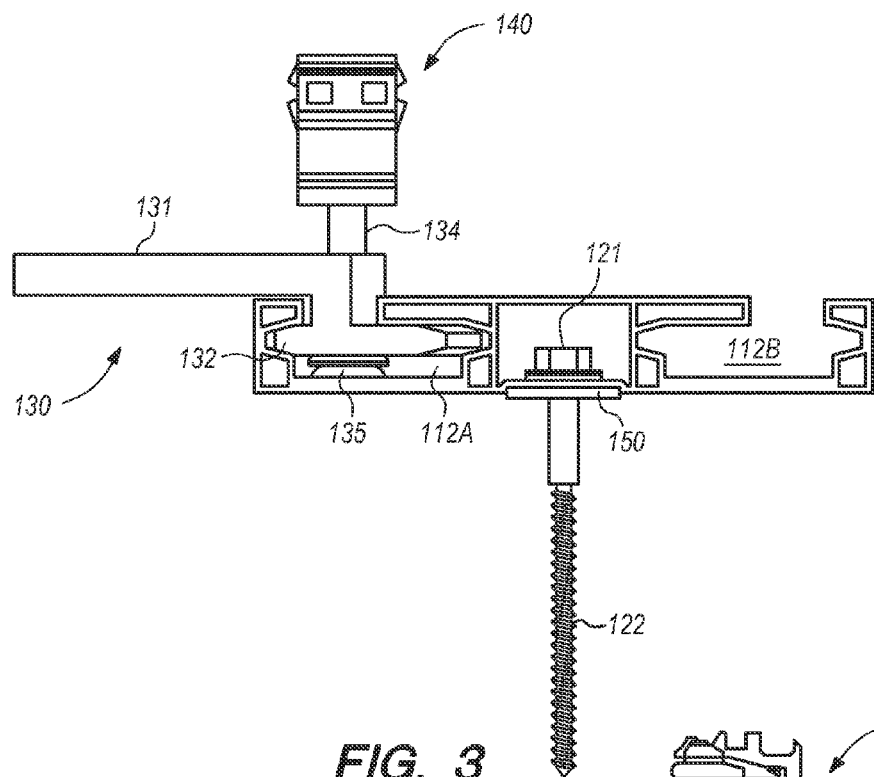
FIG. 3 is an end view of a photovoltaic mounting system according to various embodiments of the invention.
Figure 4:
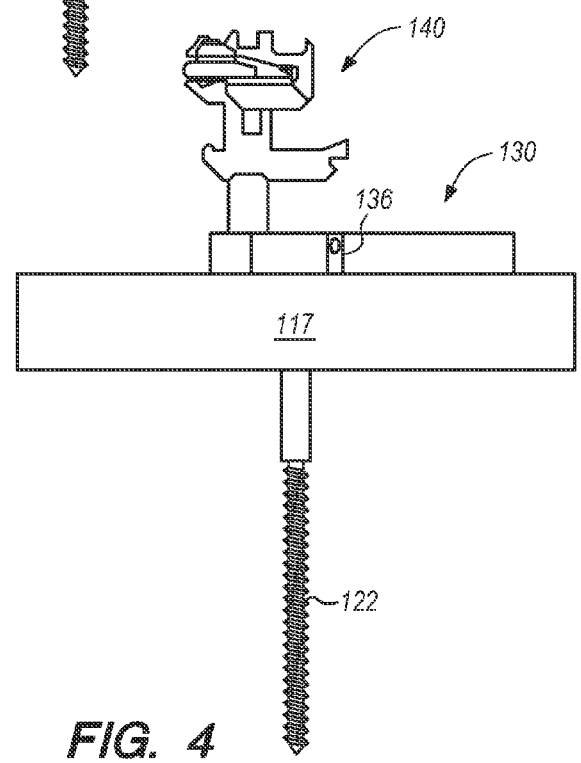
FIG. 4 is a side view of a photovoltaic mounting system according to various embodiments of the invention.
Figure 5:
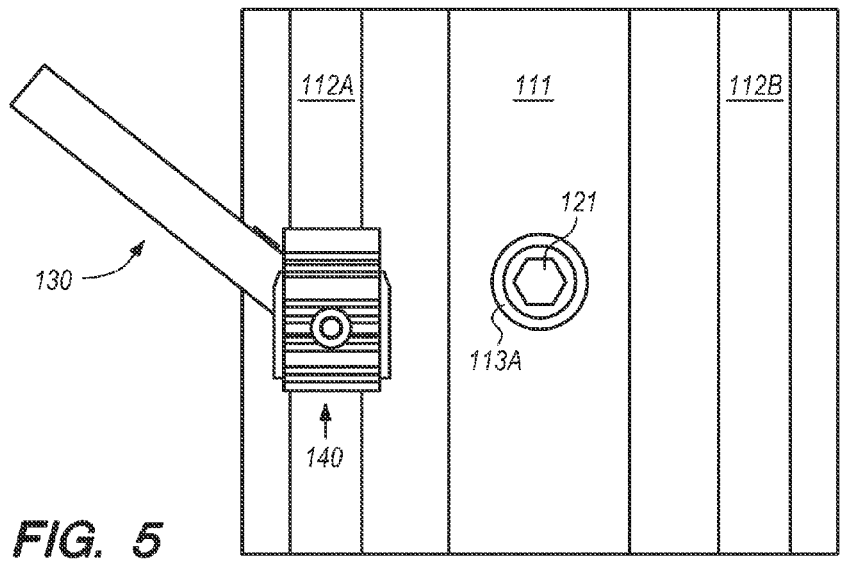
FIG. 5 is a top view of a photovoltaic mounting system according to various embodiments of the invention.

As illustrated in these figures, and in particular FIG. 3, each end of lobe 132 is tapered to match the tapering formed in the wall of each recess. This geometry may provide better fitment and tolerances than a squared edge, however, other geometries may also be used.

As shown in the Figures, base portion 110 also includes concentric openings 113A, 113B that allow lag bolt 120 to be installed through top surface 111 into a support surface such as a roof deck. Preferably top opening 113A is larger than bottom opening 113B so that lag bolt head 121 and a socket, drill and/or other tool can pass through opening 113A but be stopped by opening 113B when bolt 120 is tightened down to the roof. It should be appreciated that although only a single pair of concentric openings 113A, 113B are shown in FIGS. 1-9 (e.g., a single lag bolt), two or more pairs of concentric openings may be used to provide additional support (e.g., two or more lag bolts). Such modifications are within the spirit and scope of the invention.

In addition, base portion 110 may include pad 150 of rubber, butyl, sealant or other resilient, water-resistant material spanning the entire roof-facing side 118, or simply a portion of the bottom of base portion 110. This pad 150 may help prevent the ingress of water around the lag bolt opening as well as helping to adjust for variations in the roof surface, such as, for example, when the base portion spans two courses of shingles. Alternatively, or in addition, an installer may simply apply some sealant on underside 118 of base portion 110 and/or around the lag bolt hole in the roof surface prior to torqueing down the lag bolt.

Figure 6:
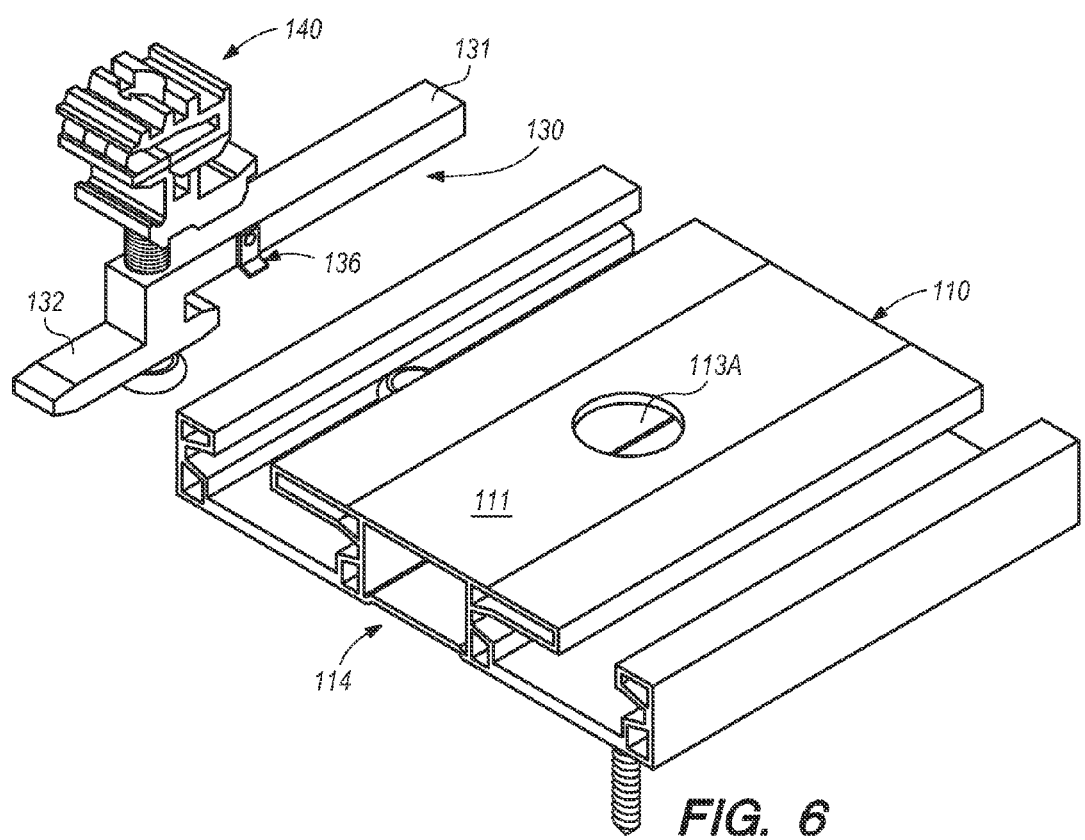
FIG. 6 is a partially exploded perspective view of the components of a photovoltaic mounting system according to various embodiments of the invention.
Figure 7:
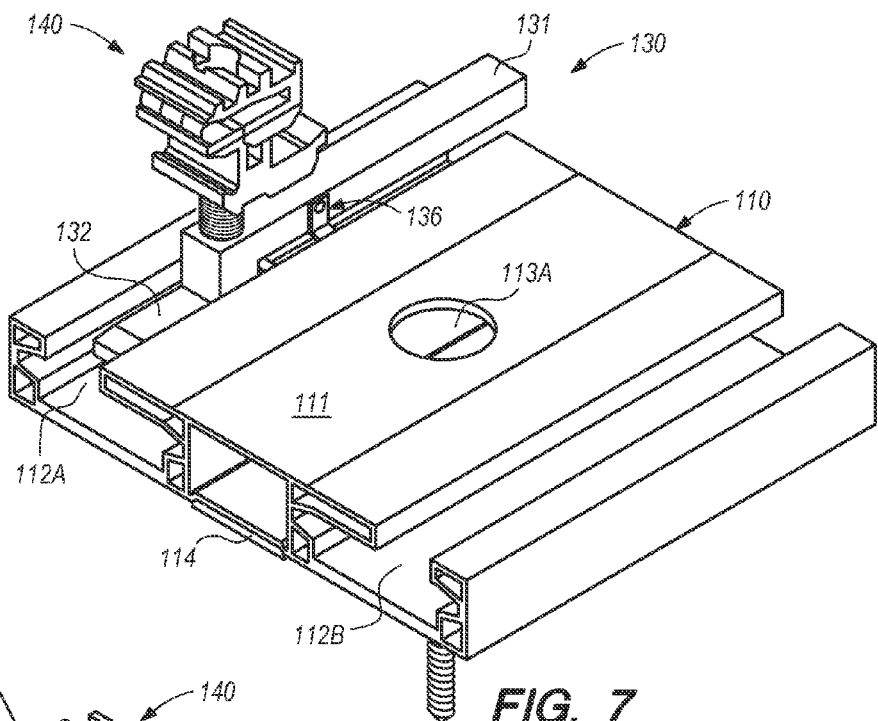
FIG. 7 is another perspective view of a photovoltaic mounting system in the unlocked position according to various embodiments of the invention.
Figure 8:
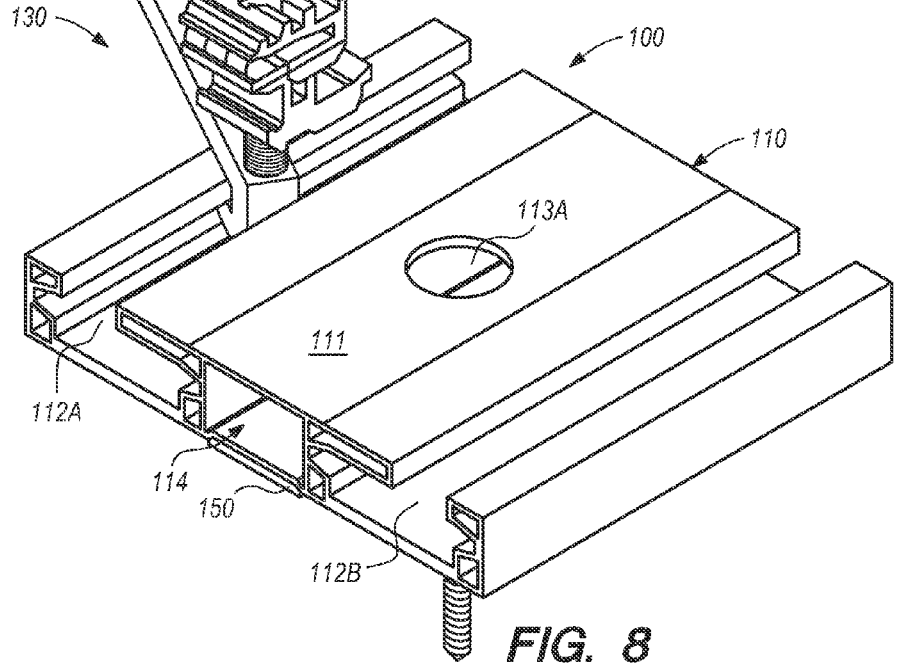
FIG. 8 is another perspective view of a photovoltaic mounting system in the partially locked position according to various embodiments of the invention.
Figure 9:
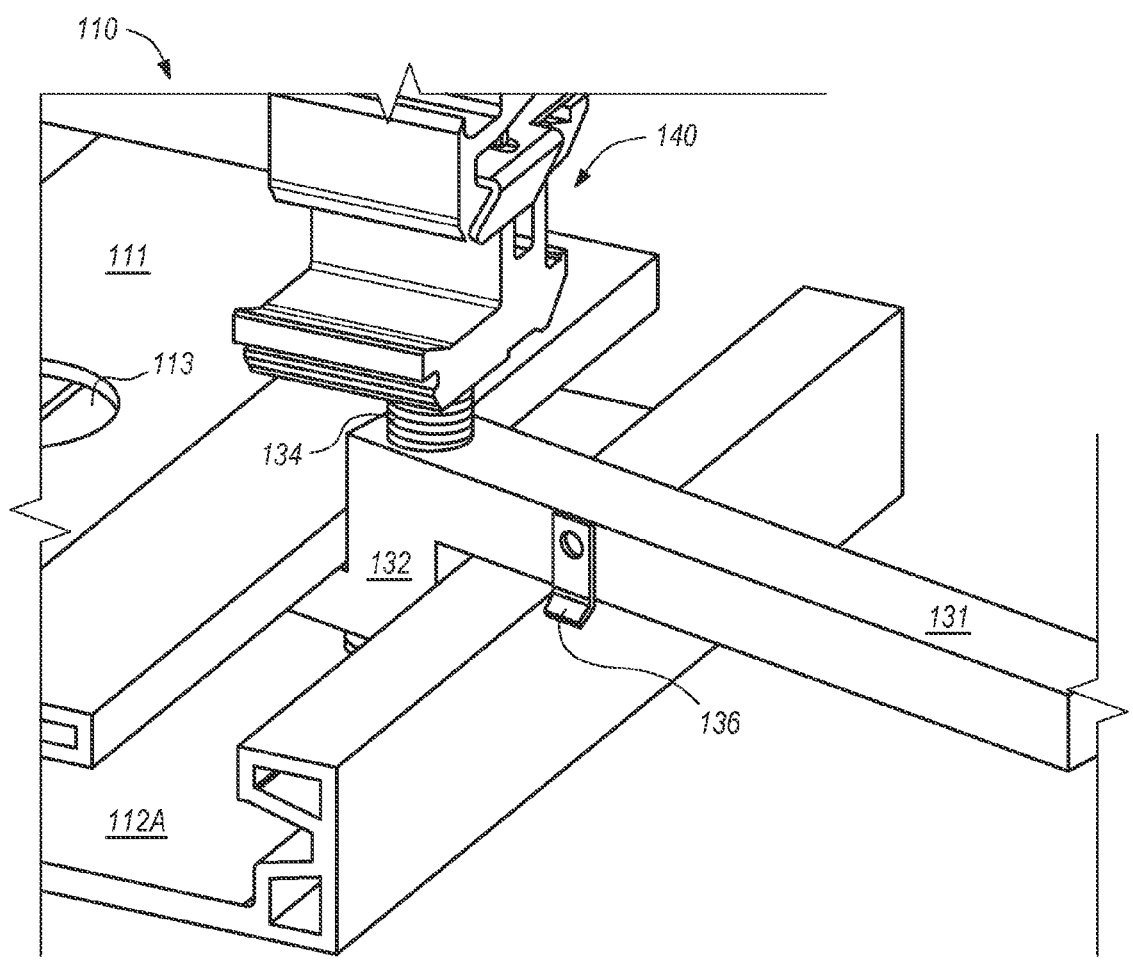
FIG. 9 is close-up perspective view of a photovoltaic mounting system in the locked position according to various embodiments of the invention.

Referring now to FIGS. 6, 7, and 9, these Figures illustrate various close-up perspective views of exemplary torque lever 130 combined with base portion 110. As shown in these figures, in various embodiments, torque lever 130 may include a catch 136 that prevents lever 131 and lobe 132 from coming unlocked after they have been torqued into the channel recess. In various embodiments, catch 136 is attached to one side of lever 131, protruding down slightly further than the bottom of lever 131, like a spring, so that once lever 131 has been rotated far enough to allow catch 136 to clear the top surface 111 of base portion 110 (see e.g., FIG. 9), catch 136 will tend to prevent the rotation in the reverse direction resulting in an unintentional release of lever lock 130. In order to release it, an operator will have to slightly lift up on torque lever 131 while rotating the catch towards the base portion (either clockwise or counterclockwise depending on which channel it is engaged with) so that the catch clears top surface 111 of base portion 110.

In a conventional photovoltaic mounting system, in particular on composite shingle roofs, a metal flashing is typically installed first, directly over the shingles, or in some cases after removing one or shingles or portions of one or more shingles. Known advantages of such flashings include additional protection against leaks and coverage of errant lag bolt pilot holes that missed the roof rafter. Known disadvantages include extra cost, poor aesthetics, and creation of additional holes in the roof surface; shingle nails often need to be removed to allow the flashing to be tucked under the up-roof course of shingles, each of which creates a potential point of water ingress.

Figure 13:
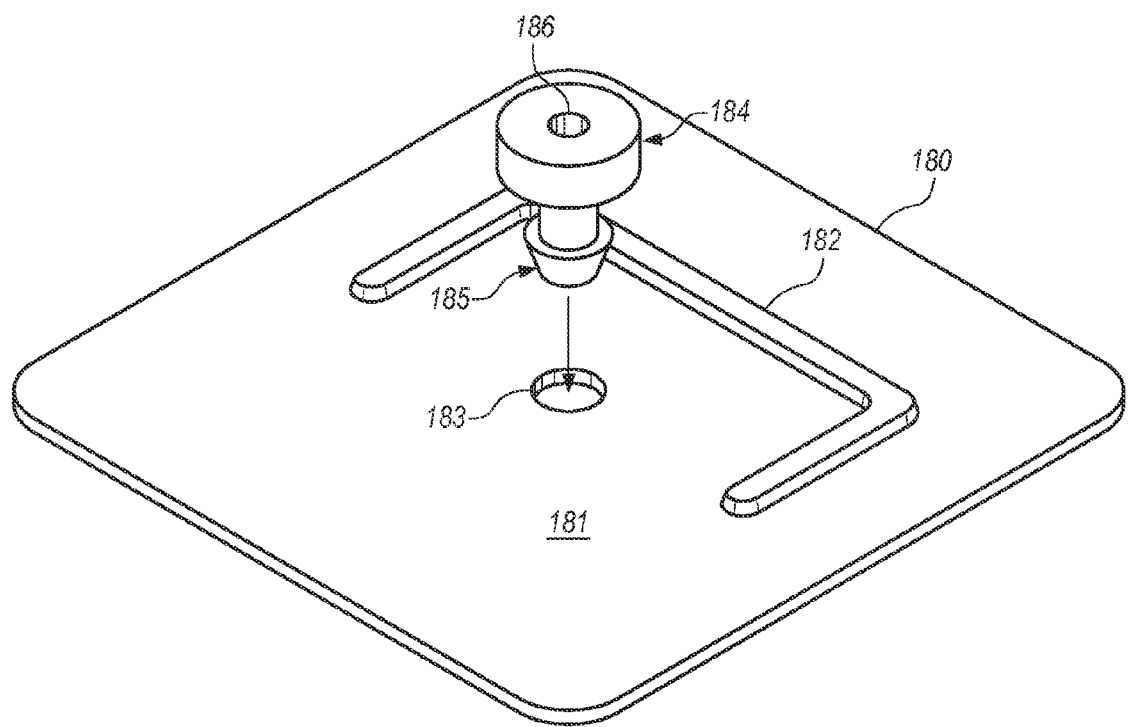
FIG. 13 is a perspective view of a flashing according to various embodiments of the invention.

The advantages and disadvantages notwithstanding, the choice of whether or not to employ flashings is not always a design choice—some jurisdictions require it. For at least this reason, various embodiments of the invention may include a base flashing, such as flashing 180 illustrated in FIG. 13. In various embodiments, flashing 180 may comprise a substantially planar sheet of metal having a flat portion 181 typically shaped into a rectangle with rounded edges or, alternatively, shaped as a disk. Flashing 181 may also comprise raised portion 182 which defines the outline of base portion 110 and which also serves to divert water running down roof away from base portion 110.

In various embodiments, flashing 180 may be installed as the first system component, at the location where a lag bolt pilot hole has been drilled, and be oriented so that raised portion 182 points up-roof (e.g., between lag bolt opening 163 and the roof peak) and so that opening 183 is located over the lag bolt drill hole or pilot hole formed in the roof (not shown in the Figure). Flashing 180 may also include a rubber gasket 184 having a bottom portion 185 and top portion 186 that is designed to be inserted into lab bolt hole 183, providing further protection against the ingress of water, in particular when compressed by base portion 100 under the force of the lag bolt. Then, in various embodiments, lag bolt 120 is pushed through concentric holes 113A, 113B, of base portion 110 until threaded portion 122 penetrates the opening in top portion 186 of gasket 184, before being torqued down into the roof. In this manner, the base portion 110 and flashing 180 can be attached to the roof surface at the same time using a single lag bolt. Alternatively, as discussed above, more than one lag bolt may be used and also, additional screws, nails, adhesive, or other fasteners may be used to secure flashing 180 to the roof surface.

In various embodiments, base portion 110 of system 100 may sit on top of flashing 180 so that it sits within the space defined by raised portion 182 and so that the concentric openings 113A, 113B are aligned directly over gasket 184 and opening 183 to permit a lag bolt to pass through all three structures (base portion 110, gasket 184, and flashing 180) before penetrating the roof surface.

Figure 10:
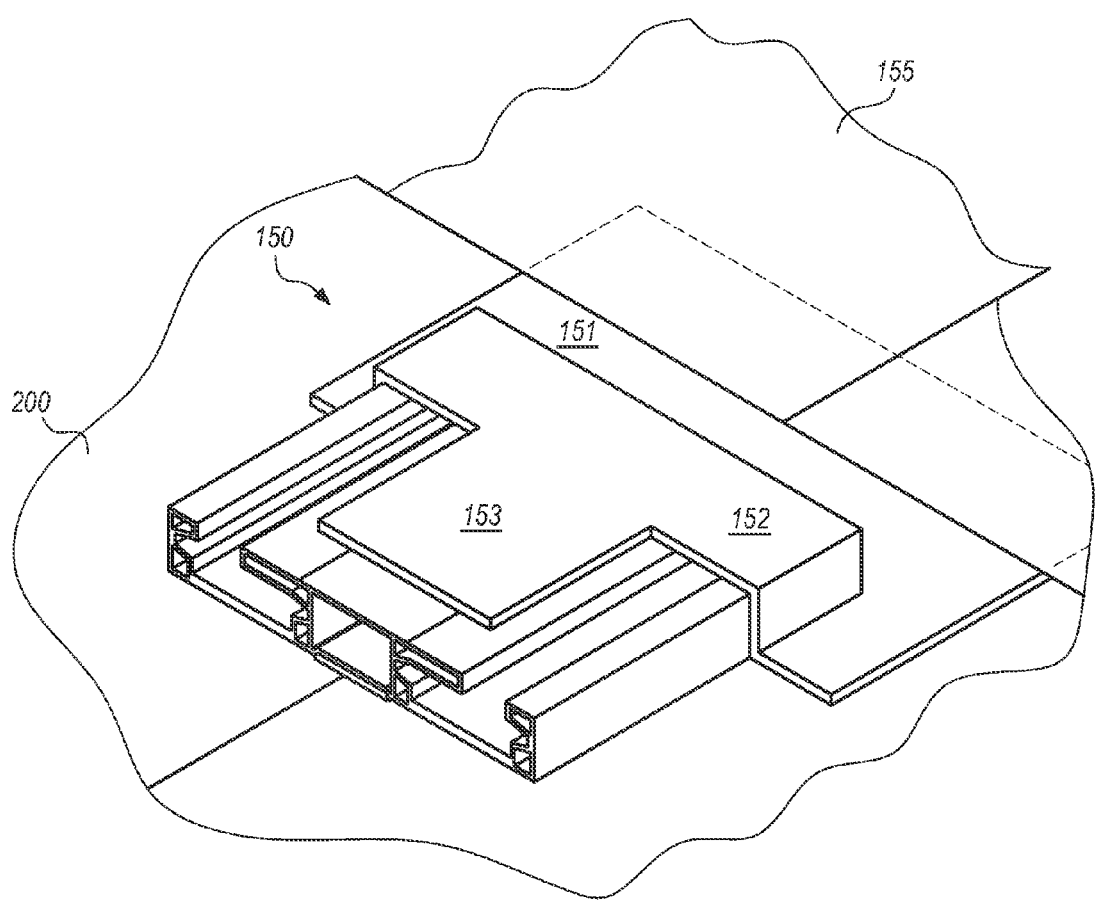
FIG. 10 is another perspective view of a photovoltaic mounting system including a flashing according to various embodiments of the invention.
Figure 11:
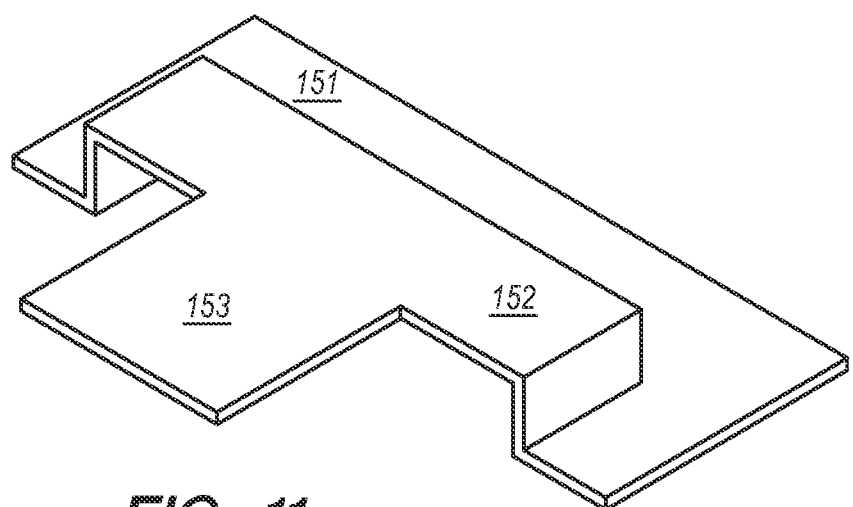
FIG. 11 is another perspective view of a flashing for a photovoltaic mounting system according to various embodiments of the invention.

Referring now to FIGS. 10 and 11, these figures illustrate an exemplary embodiment of the invention that includes a top flashing portion 150. In addition to, or as an alternative to bottom flashing 180, various embodiments of the invention may utilize a top flashing such as flashing 150. As shown in FIGS. 10 and 11, top flashing 150 may include a flat, roof-contacting portion 151 designed to sit up-roof from base portion 110, at least partially under the next course of shingles on shingled roof surface 200. This will help divert water flowing down the roof away from the base portion and ideally prevent it from going under base portion 110. Top flashing 150 may also include a raised portion 152 that is dimensioned to substantially accommodate and conceal the up-roof facing end 115 of base portion 110, sealing it off from the flow of water and extending down roof for a portion of the base portion 110 along either side 116, 117 and covering a portion of channels 112A, 112B. Top flashing 150 may also include a protrusion 153 that although in the same plane as raised portion 151, extends further down roof either partially (as shown) or completely over base portion 110, thereby covering any lag bolt openings, such as concentric holes 113A and 113B. This may also help to prevent potential leaks from both running and standing water, and may be sufficient to satisfy local code requiring the use of flashings.

Reference will now be made to FIGS. 1-9 and 12 to discuss the various photovoltaic module mounting brackets used with the various embodiments of the invention. FIGS. 1-9, illustrate a pivot-lock coupling device, such as that described in commonly assigned U.S. patent application Ser. No. 14/615,320, Publication No. 2015/0155823-A1, the disclosure of which is herein incorporated by reference in its entirety.

In various embodiments, coupling device 140 will support two adjacent photovoltaic modules that are in turn vertically supported above a roof surface by threaded stud 134, and base portion 110. Coupling device 140 has a key side (short side) and tongue side (long side) each adapted to engage with a groove formed in the frame of a photovoltaic module. For example, in FIG. 4, the key side is shown on coupling device 140 pointing left, while the tongue side is shown pointing right. Because PV is often installed on sloped roofs, there are advantages to having different key and tongue sides, in particular since one side will be resisting the down-roof pull of a PV module, while the other side will be resisting the down-roof push of the corresponding adjacent module in the next up-roof row. Both the key side and tongue side may be considered male coupling portion. In various embodiments, the key side may be installed to point down-roof allowing a photovoltaic module, section of array skirt or other structure with a female coupling portion to be mated thereto. Such a coupling device may be particularly advantageous because no tools are required to attach and detach a photovoltaic module to either the key side or the tongue side; they are simply pivot-locked into place. Also, because coupling device 140 is free to rotate about threaded stud 140 and because it has an opening in the top that permits access to a geometric recess formed in the top of stud 140, vertical adjustment of the coupling device 140 is possible from above, even after two photovoltaic modules have been attached to coupling device 140, thereby enabling an installer to level that portion of the photovoltaic array during installation without having to first remove the modules.

Figure 12:
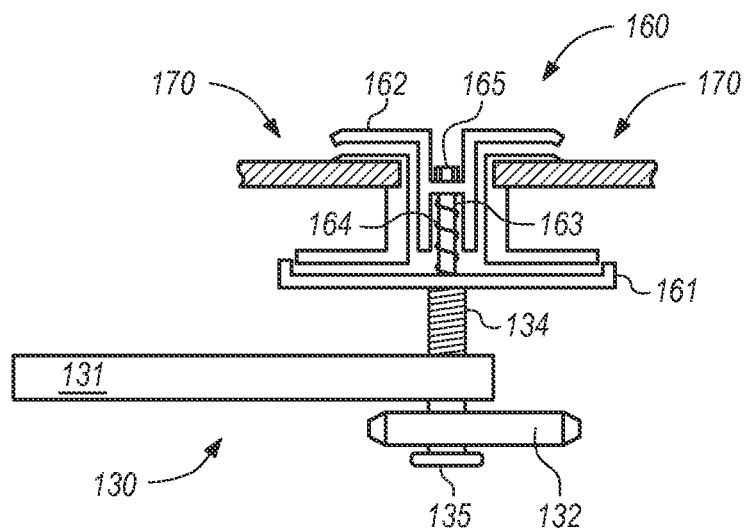
FIG. 12 is a side view of another perspective view of a photovoltaic mounting system including a flashing according to various embodiments of the invention.

Referring now to FIG. 12, this Figure illustrates an alternative embodiment in which lever lock 130 includes a clamping-style photovoltaic module connector 160 instead of rock-it coupling device 140. Clamping-style connector 160 has the advantage that it works with virtually all photovoltaic module frames and does not require them to have a female receiving portion or groove formed in the outer surface of the module frame to mate with a reciprocal key portion or tongue portion of the connector. In the example of FIG. 12, clamping-style connector 160 includes a base 161 that provides a shelf for resting a photovoltaic module on. Base portion 161 may or may not include a pair of flanges at each distal end to serve as a catch to prevent the module from sliding out under the force of gravity before the clamping connector has been engaged.

Connector 160 also includes top clamping portion 162 that moves closer to base portion 161 via shaft 163 when screw 165 is rotated. Optionally, spring 164 may bias clamping portion 162 away from base 161 to make it easier to slide photovoltaic module frames 170 into either side of base portion 161. In addition, although not visible in the figure, base portion 161 and clamping portion 162 may be long enough to allow the corners of two adjacent photovoltaic modules to be attached on each side along the connector 160, thereby supporting a two-by-two sub-array of four adjacent photovoltaic modules at the internal intersecting of their respective corners.

As seen in FIG. 12, in this exemplary embodiment, the remainder of lever lock 130 may be the same as in previous embodiments. In other words, the design and advantages of the lever lock according to various embodiments of the invention are not unique to any particular type of photovoltaic module mounting bracket, coupling or connector.

Whether a rock-it type connector, clamping-style connector or other module coupling device is used with the various embodiments of the invention, it may be desirable to incorporate integrated alternative path as way to electrically ground the photovoltaic modules connected to lever lock mounting assembly. This function is accomplished in part by choice of materials (e.g., using aluminum or other electrically conductive allow) and also by including structure that is design to make an electrically conductive bond with the photovoltaic modules. In the context of the rock-it connector, grounding is achieved through the use of a grounding clip that cuts into a portion of both PV module frames supported by the rock-it. In the case of the clamping-style module, a grounding pin, prong, or other structure may be formed into either base portion 161 or clamping portion 162 to create an alternate ground path through lever lock 130 to the roof surface.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A mounting assembly for photovoltaic modules comprising:
    a base portion having a substantially planar bottom surface, and an opposing top surface;
    a first channel formed in the base portion, accessible from the top surface;
    a recess formed in the base portion and accessible via the first channel, wherein the recess is wider than the channel in a dimension perpendicular to the first channel;
    a pair of concentric lag bolt openings formed in respective top and bottom surfaces of the base portion, wherein the lag bolt opening in the top surface is dimensioned larger than the lag bolt opening in the bottom surface; and
    a photovoltaic module lever lock, comprising:
        a lobe dimensioned to fit into the first channel at a first orientation, and to fit into the recess at a second orientation, wherein the second orientation is substantially perpendicular to the first orientation;
        a torque lever, extending from the lobe, for applying torque to the lobe to rotate the lobe between the first orientation and the second orientation; and
        a photovoltaic module connector, mechanically coupled to the lobe, for coupling together at least two photovoltaic modules.

2. The mounting assembly according to claim 1, further comprising a layer of sealant material and a release sheet covering the layer of sealant material, formed on at least a portion of the bottom surface of the base portion.

3. The mounting assembly according to claim 1, further comprising a second channel formed in the base portion that is parallel to the first channel.

4. The mounting assembly according to claim 3, wherein the first and second channels are formed on either side of the concentric lag bolt openings.

5. The mounting assembly according to claim 1, further comprising a top flashing, wherein the top flashing is adapted to fit over one end of the base portion and to cover the concentric lag bolt openings.

6. The mounting assembly according to claim 1, further comprising a threaded stud mechanically coupling the photovoltaic module connector to the lobe.

7. The mounting assembly according to claim 6, wherein a distance between the photovoltaic module connector and the lobe is adjustable by either rotating the stud or rotating the module connector about the stud.

8. The mounting assembly according to claim 7, wherein the module connector comprises an opening in a top portion thereof, said opening revealing one end of the threaded stud and permitting insertion of a tool to rotate the threaded stud, thereby altering a distance between the module connector and the lobe.

9. The mounting assembly according to claim 1, wherein the photovoltaic module connector is a clamping-type connector.

10. The mounting assembly according to claim 1, further comprising a bottom flashing, wherein the bottom flashing comprises a substantially planar sheet with a raised portion dimensioned to partially fit around an outer surface of at least a portion of three sides of the base portion and further includes a lag bolt through-hole positioned to be collinear with the pair of concentric lag bolt openings in the base portion.

11. The mounting assembly according to claim 10, further comprising a gasket extending through the lag bolt through-hole and adapted to receive a threaded portion of a lag bolt.

12. The mounting assembly according to claim 1, wherein the photovoltaic module lever lock further comprises a catch formed on the torque lever to prevent unintended rotation of the torque lever with respect to the base portion after the lobe is in the second orientation.

13. An assembly comprising:
a photovoltaic module lever lock comprising a lobe at a first end and a torque lever at second end, wherein the torque lever and lobe are substantially parallel and are interconnected by a perpendicular portion that elevates the torque lever above the lobe, wherein rotation of the torque lever results in an equivalent rotation of the lobe;
a threaded stud passing through the lobe and the perpendicular portion; and
a photovoltaic module connector for connecting together at least two photovoltaic modules, wherein the photovoltaic module connector comprises a threaded opening for receiving the threaded stud.

14. The assembly according to claim 13, further comprising:
a base portion having a substantially planar bottom surface and an opposing top surface;
a channel formed in the base portion, accessible from the top surface;
a recess formed in the base portion and accessible via the channel, wherein the recess is wider than the channel in a dimension perpendicular to the channel;
wherein the lobe is dimensioned to fit into the channel at a first orientation, and to fit into the recess at a second orientation, wherein the second orientation is substantially perpendicular to the first orientation.

15. The assembly according to claim 14, wherein the photovoltaic module lever lock further comprises a catch formed on the torque lever to prevent unintended rotation of the torque lever with respect to the base portion.

16. The assembly according to claim 13, wherein the threaded stud is engaged within the threaded opening of the photovoltaic module connector.

17. The assembly according to claim 13, wherein the photovoltaic module lever lock is a unitary photovoltaic module lever lock.

18. The assembly according to claim 13, wherein the perpendicular portion interconnecting the torque lever to the lobe is integrally formed with both the torque lever and the lobe.

19. A photovoltaic module lever lock assembly, comprising:
a lobe having a first width at a first orientation and a second width at a second orientation, wherein the second orientation is substantially perpendicular to the first orientation;
a torque lever, extending from the lobe, for manually applying torque to the lobe to rotate the lobe between the first orientation and the second orientation;
a photovoltaic module connector, mechanically coupled to the lobe and torque lever, for coupling together two photovoltaic modules; and
a base portion having a channel formed therein, and a corresponding recess collinear with and accessed via the channel, wherein the channel is dimensioned to receive the lobe in the first orientation and the recess is dimensioned to receive the lobe in the second orientation.

20. The photovoltaic module lever lock assembly according to claim 19, further comprising a catch formed on the torque lever to prevent unintended rotation of the torque lever with respect to the base portion.

* * * * *